US012620517B2

(12) United States Patent
Woo et al.

(10) Patent No.: US 12,620,517 B2
(45) Date of Patent: May 5, 2026

(54) LINE FILTER AND DISPLAY DEVICE COMPRISING SAME

(71) Applicant: SAMSUNG ELECTRONICS CO., LTD., Suwon-si (KR)

(72) Inventors: Wonmyung Woo, Suwon-si (KR); Jeongil Kang, Suwon-si (KR); Sungyong Joo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 307 days.

(21) Appl. No.: 18/136,994

(22) Filed: Apr. 20, 2023

(65) Prior Publication Data

US 2023/0260688 A1 Aug. 17, 2023

Related U.S. Application Data

(63) Continuation of application No. PCT/KR2021/014064, filed on Oct. 13, 2021.

(30) Foreign Application Priority Data

Nov. 30, 2020 (KR) ........................ 10-2020-0163929

(51) Int. Cl.
*H01F 27/06* (2006.01)
*H01F 27/02* (2006.01)
(Continued)

(52) U.S. Cl.
CPC ............. *H01F 27/06* (2013.01); *H01F 27/02* (2013.01); *H01F 27/24* (2013.01); *H01F 27/306* (2013.01);
(Continued)

(58) Field of Classification Search
None
See application file for complete search history.

(56) References Cited

U.S. PATENT DOCUMENTS 5,670,924 A 9/1997 Heinrich
10,192,676 B2 * 1/2019 Ohdaira ................ H01F 27/266
(Continued)

FOREIGN PATENT DOCUMENTS

CN 1967744 A 5/2007
JP 2000-114905 4/2000
(Continued)

OTHER PUBLICATIONS

Partial Supplementary European Search Report dated Feb. 15, 2024 for corresponding application 21898338.5.
(Continued)

*Primary Examiner* — Hung S. Bui
*Assistant Examiner* — Elisa Sasserath
(74) *Attorney, Agent, or Firm* — STAAS & HALSEY LLP

(57) ABSTRACT

A display device including a display panel which comprises: a power supply board comprising a line filter. The line filter, to remove noise, comprising: a case connectable to a printed circuit board to thereby electrically connect the line filter to the printed circuit board; a magnetic core to be accommodated in the case; a core cover coupleable to the case to cover the magnetic core; a coil wound around an outside of the case and the core cover; and a separator coupleable to the case and the core cover. The separator comprises: a base; an isolating portion protruding from the base to be insertable into the case and the core cover so as to isolate a region in which the coil is wound; and a stepped portion protruding from the base and in contact with one surface of the case to separate the base from the printed circuit board.

10 Claims, 9 Drawing Sheets

(51) Int. Cl.

| | | |
|---|---|---|
| *H01F 27/24* | (2006.01) |
| *H01F 27/30* | (2006.01) |
| *H01F 27/32* | (2006.01) |
| *H05K 7/14* | (2006.01) |

(52) U.S. Cl.
CPC ......... *H01F 27/324* (2013.01); *H05K 7/1427* (2013.01); *H01F 2027/065* (2013.01)

(56) References Cited

U.S. PATENT DOCUMENTS

| | | | | |
|---|---|---|---|---|
| 10,644,588 | B2 | 5/2020 | Werker et al. | |
| 11,250,986 | B2 | 2/2022 | Hwang et al. | |
| 11,289,259 | B2 | 3/2022 | Nah et al. | |
| 2011/0176282 | A1 | 7/2011 | Kim et al. | |
| 2012/0051012 | A1* | 3/2012 | Joo | H05K 9/0054 |
| | | | | 361/753 |
| 2012/0319810 | A1* | 12/2012 | Tseng | H01F 27/027 |
| | | | | 336/65 |
| 2014/0084790 | A1 | 3/2014 | Won et al. | |
| 2018/0061919 | A1* | 3/2018 | Toyotaka | H10K 59/50 |
| 2019/0272948 | A1* | 9/2019 | Hwang | C09D 7/40 |
| 2020/0043642 | A1 | 2/2020 | Wunsch et al. | |

FOREIGN PATENT DOCUMENTS

| | | | |
|---|---|---|---|
| JP | 4877616 | B2 | 2/2012 |
| JP | 2017-5572 | | 1/2017 |
| JP | 2018-6460 | | 1/2018 |
| JP | 6555754 | | 8/2019 |
| JP | 6562830 | | 8/2019 |
| JP | 6696343 | | 5/2020 |
| KR | 20-0317201 | | 6/2003 |
| KR | 10-2006-0085805 | | 7/2006 |
| KR | 10-0879992 | | 2/2009 |
| KR | 10-2012-0088645 | | 8/2012 |
| KR | 10-1208240 | | 12/2012 |
| KR | 10-2015-0143251 | | 12/2015 |
| KR | 10-1610337 | | 4/2016 |
| KR | 10-1795342 | | 12/2017 |
| KR | 10-2018-0071826 | | 6/2018 |
| KR | 10-2018-0071828 | | 6/2018 |
| KR | 10-1878160 | | 7/2018 |
| KR | 10-2019-0029420 | | 3/2019 |
| KR | 10-2019-0033717 | | 4/2019 |
| KR | 10-2019-0081399 | | 7/2019 |
| KR | 10-2010256 | | 8/2019 |

OTHER PUBLICATIONS

Extended European Search Report dated May 7, 2024 for corresponding application 21898338.5.
Office Action issued by the Korean Patent Office on Aug. 1, 2024 for Korean Patent Application No. 10-2020-0163929.
International Search Report issued in International Application No. PCT/KR2021/014064 dated Feb. 10, 2022.
Written Opinion issued in International Application No. PCT/KR2021/014064 dated Feb. 10, 2022.

* cited by examiner

LINE FILTER AND DISPLAY DEVICE COMPRISING SAME

CROSS-REFERENCE TO RELATED APPLICATION

This application is a continuation application, under 35 U.S.C. § 111(a), of international application No. PCT/KR2021/014064, filed on Oct. 13, 2021, which claims priority under 35 U. S. C. § 119 to Korean Patent Application No. 10-2020-0163929, filed Nov. 30, 2020, the disclosures of which are incorporated herein by reference in their entirety.

BACKGROUND

Field

The present disclosure relates to a line filter including an improved structure, and a display device including the same.

Discussion of Related Art

Electronic devices generate electromagnetic waves, and electromagnetic waves are radiated to other nearby devices, which may act as noise affecting the operation of nearby devices. That is, electromagnetic waves may cause Electro Magnetic Interference (EMI). In addition, because electromagnetic waves may also affect the human body, there are international regulations to prevent the negative influence of the electromagnetic waves.

Therefore, a noise filter may be provided in the electronic device to transmit a current required for operation and to remove noise. This may be equally provided in the display device. A line filter may generally be installed on a power supply board that supplies power to a display device, and there is a demand for producing the line filter that is simply installed without a separate structure.

SUMMARY

One aspect of the present disclosure provides a display device including a display panel, the display device including a power supply board, configured to supply power to the display device, and including a line filter. The line filter is configured to remove noise and the line filter includes a case connectable to a printed circuit board to thereby allow the line filter to be electrically connected to the printed circuit board, a magnetic core to be accommodated in the case while the case is connected to the printed circuit board, a core cover coupleable to the case to cover the magnetic core while the magnetic core is accommodated in the case, a coil wound around an outside of the case and the core cover, and a separator coupleable to the case and the core cover. The separator includes a base, an isolating portion protruding from the base to be insertable into the case and the core cover to thereby allow the separator to be coupled to the case and the core cover so as to isolate a region in which the coil is wound, and a stepped portion protruding from the base and in contact with one surface of the case to separate the base from the printed circuit board.

The case and the core cover may have an annular shape. The case may include a first guide rib protruding toward a hollow portion of the case to allow the separator to be inserted into the hollow portion of the case, and the core cover may include a second guide rib protruding toward a hollow portion of the core cover to allow the separator to be inserted into the hollow portion of the core cover. The stepped portion may be in contact with the first guide rib.

The printed circuit board may include a hole into which at least a portion of the line filter is inserted. The base of the separator of the line filter may be configured to cover the hole.

Alternate current (AC) power may be applied to the power supply board through a live line and a neutral line. The region, in which the coil is wound, may include a first region on a first side of the case and the core cover along a first direction, the first region being where a coil connected to the live line is wound, and a second region on a second side of the case and the core cover along the first direction, the second region being where a coil connected to the neutral line is wound. The isolating portion may be configured to pass through the hollow portion of the case and the hollow portion of the core cover to isolate the first region and the second region from each other.

The coil may include a first coil wound around the first region and a second coil wound around the second region. The second guide rib may further protrude in a second direction to prevent the first coil and the second coil from coming into contact with each other.

The core cover may include a coupling protrusion protruding downward from an outer circumferential surface of the core cover to be coupled to an upper side of the case. The case may include a coupling groove positioned to correspond to the coupling protrusion.

The printed circuit board may include a hole into which at least a portion of the line filter is insertable. The case may include a fixing guide protruding downward to be in contact with at least a portion of a surface of the printed circuit board where the hole of the printed circuit board is formed, so as to guide a fixation of the line filter based on the line filter being connected to the printed circuit board.

The case may include a receiving portion having an annular shape to accommodate the magnetic core, a connector formed on an outer circumferential surface of the receiving portion, the connector including a connection pin to allow the line filter to be electrically connected to the printed circuit board, and a contact portion protruding downward from the connector to be in contact with the printed circuit board.

The case may include an indicator protrusion protruding downward from the connector to guide a direction of the line filter along which the line filter is electrically connected to the printed circuit board.

The case and the core cover may be formed of different materials, and the case may include a phenol-based resin to allow the case to have a heat resistance higher than a heat resistance of the core cover.

Another aspect of the present disclosure provides a power supply board configured to supply power to an electronic device, the power supply board including a line filter electrically connectable to a printed circuit board to remove noise. The line filter includes a case through which the line filter is connectable to the printed circuit board, and formed in an annular shape, a magnetic core formed in an annular shape to be accommodated in the case while the case is connected to the printed circuit board, a core cover formed in an annular shape and coupleable to the case so as to cover the magnetic core while the magnetic core is accommodated in the case, a coil wound around an outside of the case and the core cover, and a separator coupleable to the case and the core cover to separate a region in which the coil is wound. The case includes a receiving portion in an annular shape to accommodate the magnetic core, a connector formed on an outer circumferential surface of the receiving portion, the connector including a connection pin through which the line filter is electrically connected to the printed circuit board, and a contact portion in contact with the printed circuit board to fix the line filter based on the line filter being connected to the printed circuit board.

The contact portion may protrude from the connector toward the printed circuit board.

The printed circuit board may include a hole into which the line filter is inserted. The case may include a fixing guide protruding downward to be in contact with at least a portion of a surface of the printed circuit board, which forms the hole, so as to fix the line filter based on the line filter being connected on the printed circuit board.

The core cover may include a coupling protrusion protruding downward from an outer circumferential surface of the core cover to be coupled to an upper side of the case. The case may include a coupling groove provided to correspond to the coupling protrusion.

The printed circuit board may include a hole into which the line filter is inserted. The separator may include a base provided to cover the hole, an isolating portion protruding from the base to be inserted into the case and the core cover so as to isolate a region in which the coil is wound, and a stepped portion protruding from the base and coming in contact with one surface of the case to separate the base from the printed circuit board.

The case may include a first guide rib protruding toward a hollow of the case to allow the separator to be inserted into the hollow of the case, and the core cover may include a second guide rib protruding toward a hollow of the core cover to allow the separator to be inserted into the hollow of the core cover. The stepped portion may be in contact with the first guide rib.

Alternate current (AC) power may be applied to the power supply board through a live line and a neutral line. The region, in which the coil is wound, may include a first region disposed on one side of the case and the core cover, the first region in which a coil connected to the live line is wound, and a second region disposed on the other side of the case and the core cover, the second region in which a coil connected to the neutral line is wound. The isolating portion may pass through the hollow of the case and the core cover to isolate the first region and the second region.

The coil may include a first coil wound around the first region and a second coil wound around the second region. The core cover may be coupled to an upper side of the case, and the second guide rib may protrude upward to prevent the first coil and the second coil from coming into contact with each other.

The case and the core cover may be formed of different materials, and the case may include a phenol-based resin to allow the case to have a higher heat resistance than the core cover.

Another aspect of the present disclosure provides a manufacturing method of a power supply board including a line filter electrically connected to a printed circuit board to remove noise, the manufacturing method including preparing a case, allowing a magnetic core to be accommodated in the case, forming a first region and a second region in which a coil is wound and coupling a core cover to the case to cover the magnetic core, soldering the coil to a plurality of connection pins provided in the case, winding a coil around the first region and the second region, inserting a separator passing through the case and core cover, connecting at least one of the plurality of connection pins to the printed circuit board so as to allow a live line or a neutral line of alternate current (AC) power to be connected to the coil wound around the first region, and connecting at least one of the plurality of connection pins to the printed circuit board so as to allow the other of the live line or the neutral line of AC power to be connected to the coil wound around the second region. The core cover protrudes in one direction to prevent the coil wound around the first region and the coil wound around the second region from coming into contact with each other.

BRIEF DESCRIPTION OF THE DRAWINGS

The above and other objects, features and advantages of the present disclosure will become more apparent to those of ordinary skill in the art by describing in detail exemplary embodiments thereof with reference to the accompanying drawings, in which.

DETAILED DESCRIPTION OF EXEMPLARY EMBODIMENTS

Figure 1:
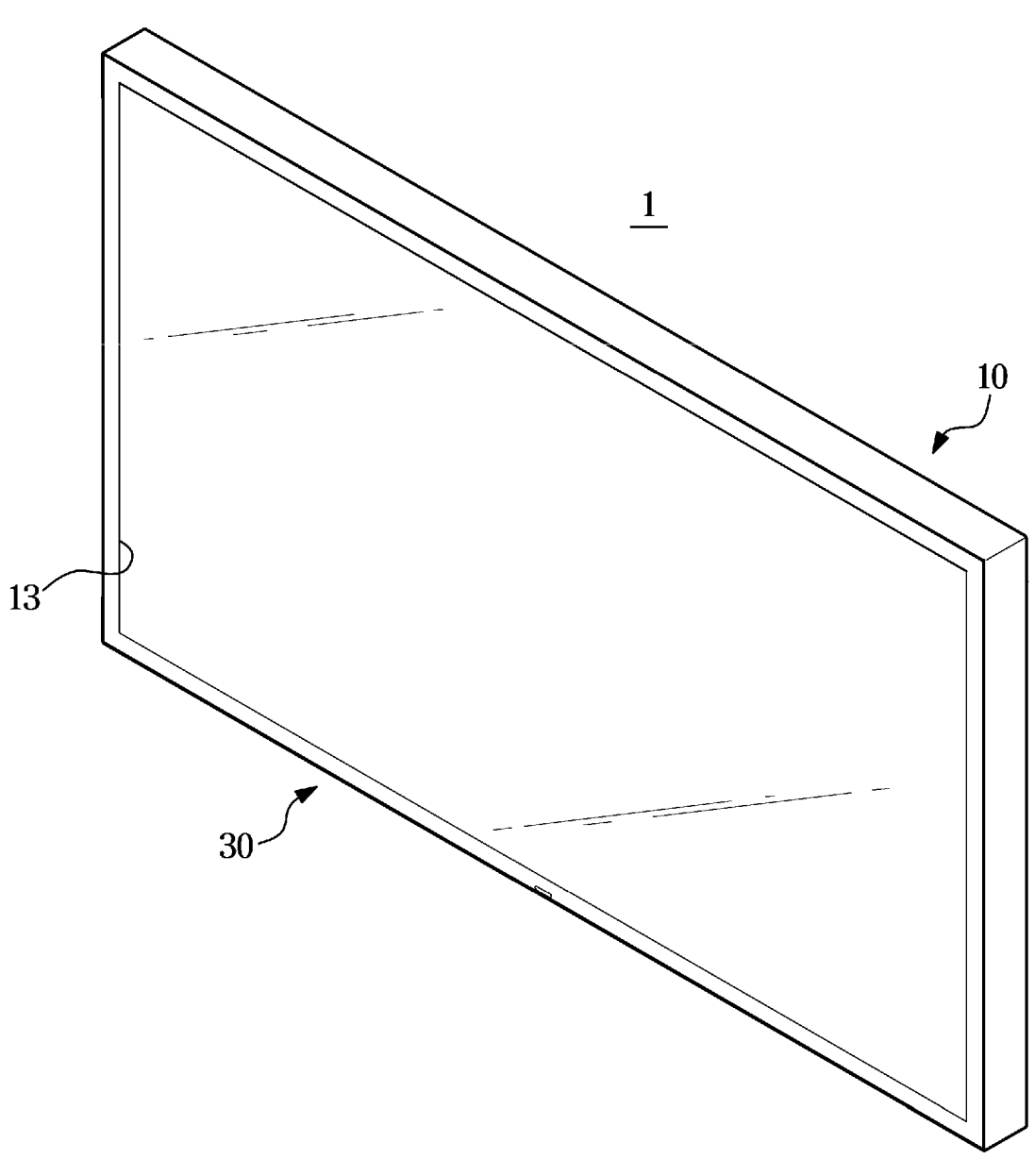
FIG. 1 is a view illustrating a display device according to one embodiment of the present disclosure.

Embodiments described in the disclosure and configurations shown in the drawings are merely examples of the embodiments of the disclosure, and may be modified in various different ways at the time of filing of the present application to replace the embodiments and drawings of the disclosure.

In addition, the same reference numerals or signs shown in the drawings of the disclosure indicate elements or components performing substantially the same function.

Also, the terms used herein are used to describe the embodiments and are not intended to limit and/or restrict the disclosure. The singular forms "a," "an" and "the" are intended to include the plural forms as well, unless the context clearly indicates otherwise. In this disclosure, the terms "including", "having", and the like are used to specify features, numbers, steps, operations, elements, components, or combinations thereof, but do not preclude the presence or addition of one or more of the features, elements, steps, operations, elements, components, or combinations thereof.

It will be understood that, although the terms first, second, third, etc., may be used herein to describe various elements, but elements are not limited by these terms. These terms are only used to distinguish one element from another element. For example, without departing from the scope of the disclosure, a first element may be termed as a second element, and a second element may be termed as a first element. The term of "and/or" includes a plurality of combinations of relevant items or any one item among a plurality of relevant items.

In the following detailed description, the terms of "front side", "rear side", "left side", "right side" and the like may be defined by the drawings, but the shape and the location of the component is not limited by the term.

The present disclosure is directed to providing a line filter having a reduced production cost and an improved production efficiency, and a display device including the same.

Further, the present disclosure is directed to providing a power supply board and a display device having a slim design by including a line filter having a reduced thickness.

It is possible to provide a line filter with a reduced production cost and an improved production efficiency by reducing subsidiary materials, and a display device including the same.

It is possible to provide a power supply board and a display device having a slim design by including a line filter in which a thickness thereof is reduced by omitting an additional structure.

Hereinafter exemplary embodiments of the present disclosure will be described in detail with reference to the accompanying drawings.

Figure 2:
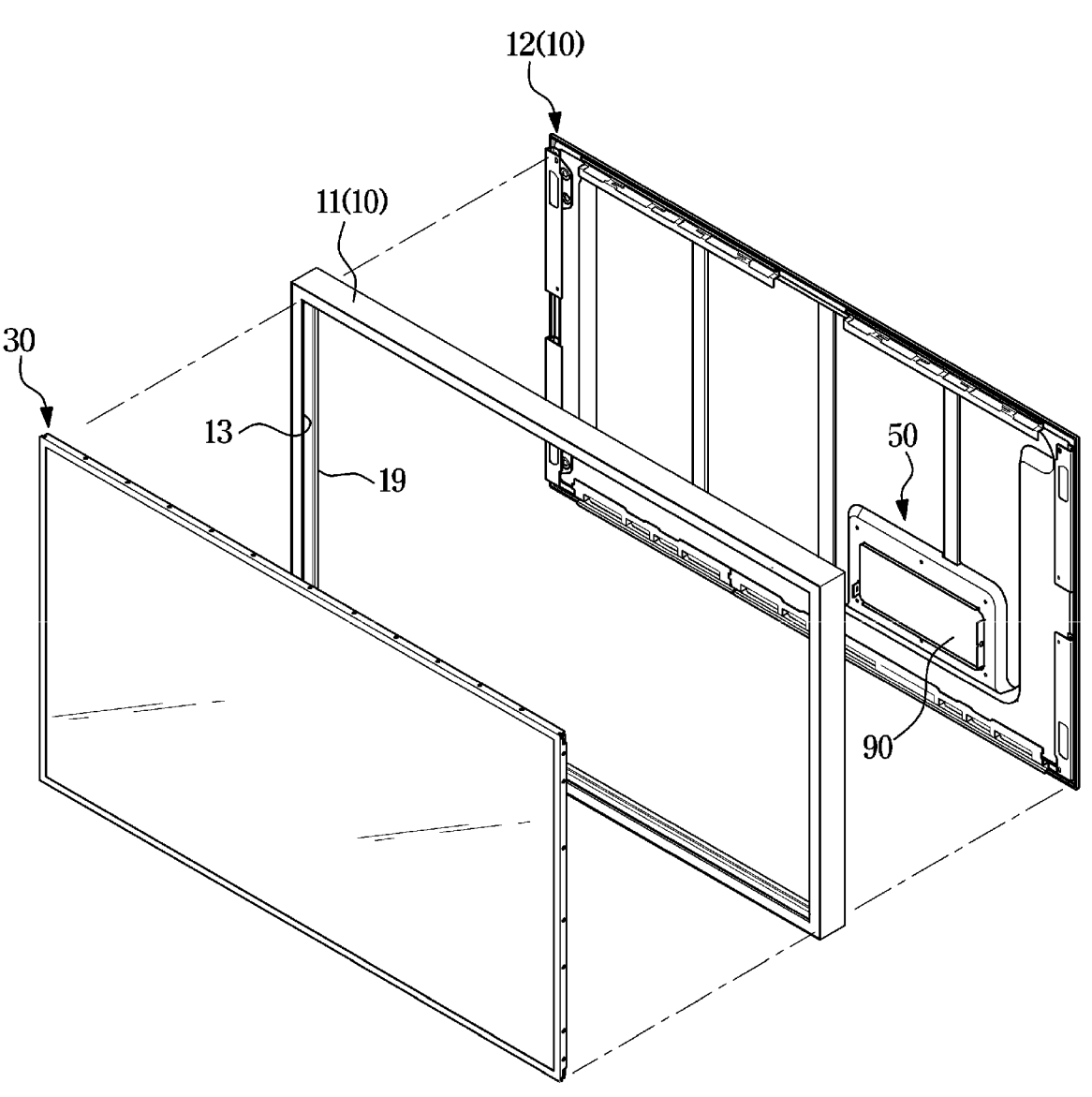
FIG. 2 is an exploded perspective view of the display device shown in FIG. 1 according to an embodiment of the present disclosure.

FIG. 1 is a view illustrating a display device according to one embodiment of the present disclosure. FIG. 2 is an exploded perspective view of the display device shown in FIG. 1.

Referring to FIGS. 1 and 2, a display device 1 may include a housing 10 forming an exterior. The housing 10 may be provided to be installed outdoors. The housing 10 may include an opening 13. Particularly, the opening 13 may be formed on a front surface of the housing 10.

The housing 10 may include an outer frame 11. The outer frame 11 may have a box shape with open front and rear surfaces. The open front surface of the outer frame 11 may be defined as the opening 13. That is, the opening 13 may be formed on the front surface of the outer frame 11.

The housing 10 may further include a rear cover 12. The rear cover 12 may be coupled to the outer frame 11. Particularly, the rear cover 12 may be coupled to the open rear surface of the outer frame 11 to form the exterior of the display device 1 together with the outer frame 11. That is, the rear cover 12 may be coupled to a rear opening 19.

The display device 1 may further include a display module 30. The display module 30 may be disposed inside the housing 10. The display module 30 may be disposed inside the housing 10.

The display module 30 may include a display panel (not shown). A screen may be provided on the display panel. The display panel may display various images on the screen according to an image signal input from the outside. At this time, the display panel may be one of a light emitting display panel in which a plurality of pixels forming the display panel generates an image by generating light by itself, or a non-emitting display in which a plurality of pixels generates an image by reflecting/transmitting/blocking light.

Although not shown in the drawings, the display panel may include a liquid crystal layer, a transparent electrode layer, a transparent substrate, and a color filter.

The display device 1 may include a power supply board 50 configured to supply power to the display device 1. The power supply board 50 may be disposed between the rear cover 12 and a board cover 90. That is, the power supply board 50 may be protected from the outside of the display device 1 by the rear cover 12 and the board cover 90. However, the location of the power supply board 50 is not limited thereto.

Figure 3:
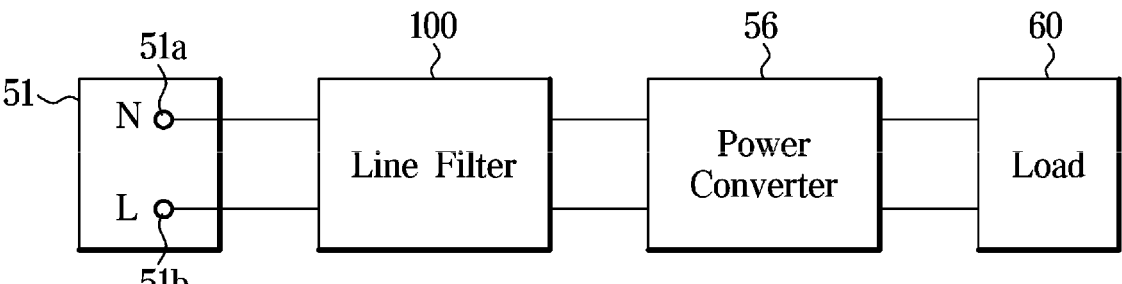
FIG. 3 is a circuit diagram of a line filter in the display device shown in FIG. 1 according to an embodiment of the present disclosure.

FIG. 3 is a circuit diagram of a line filter in the display device shown in FIG. 1.

Referring to FIG. 3, alternate current (AC) power may be applied to a line filter 100 according to one embodiment of the present disclosure. An input terminal 51 of the AC power may include a first input terminal 51a connected to a live line and a second input terminal 51b connected to a neutral line of the AC power.

An electronic device such as the display device may be provided with the power supply board 50 for supplying power. The line filter 100 may be provided on the power supply board 50 to reduce Electro Magnetic Interference (EMI).

The display device may include a power converter 56. The power converter may be disposed between the line filter 100 and a load 60.

The line filter 100 including the above structure may be disposed between the AC power input terminal 51 and the load 60 to attenuate electromagnetic waves (noise) caused by the AC power and the load 60. Accordingly, it is possible to protect the circuit from noise. In addition, it is possible to prevent electromagnetic waves from being emitted to the outside and affecting external electronic devices or affecting the human body.

However, the line filter 100 may be applied not only to AC power, but also to DC power lines. Accordingly, the line filter 100 may attenuate electromagnetic waves (noise) of the DC power.

A coil 150 may be wound around the line filter 100, and thus a magnetic field may be generated. The above-described magnetic field may cause electromagnetic induction in the coil 150, and high-frequency noise may be filtered out by the coil 150. A detail description will be omitted.

Figure 4:
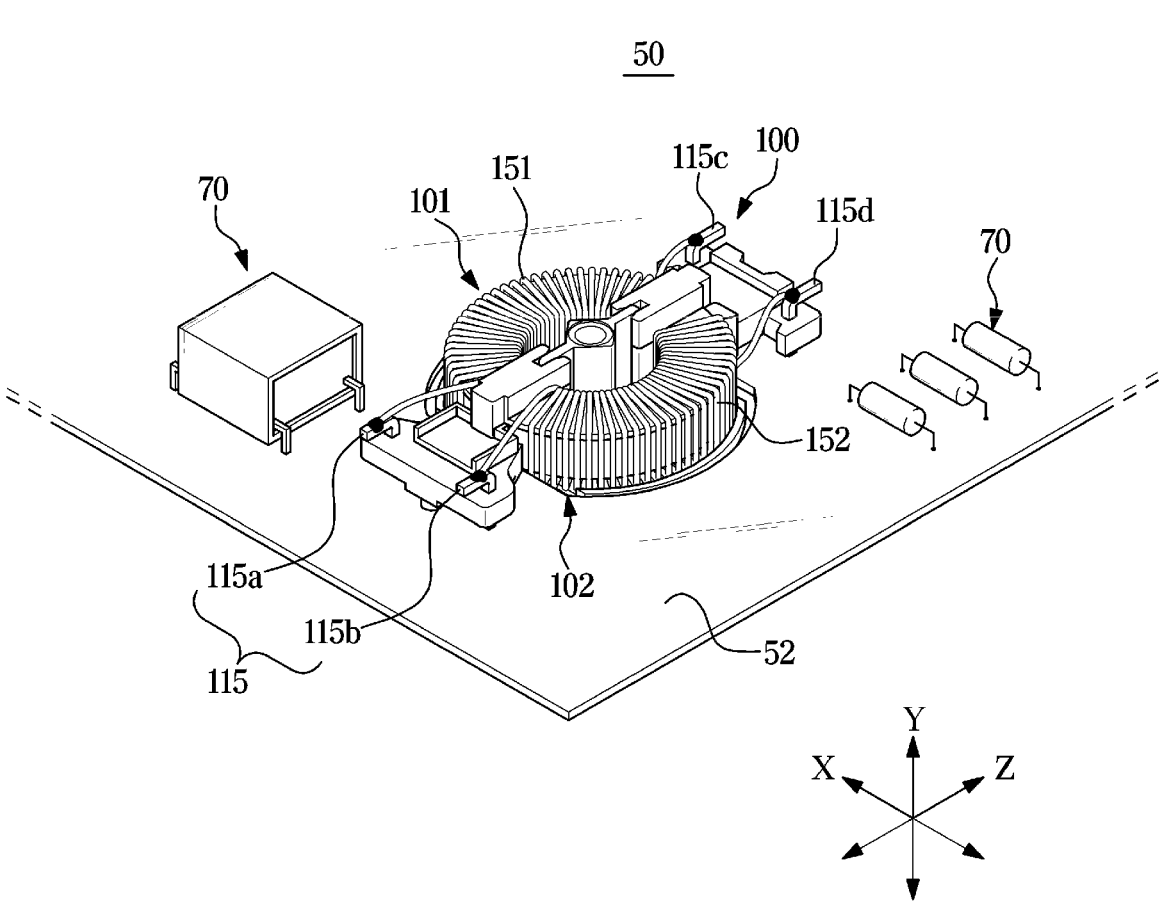
FIG. 4 is a view illustrating the line filter in the display device shown in FIG. 1 according to an embodiment of the present disclosure.
Figure 5:
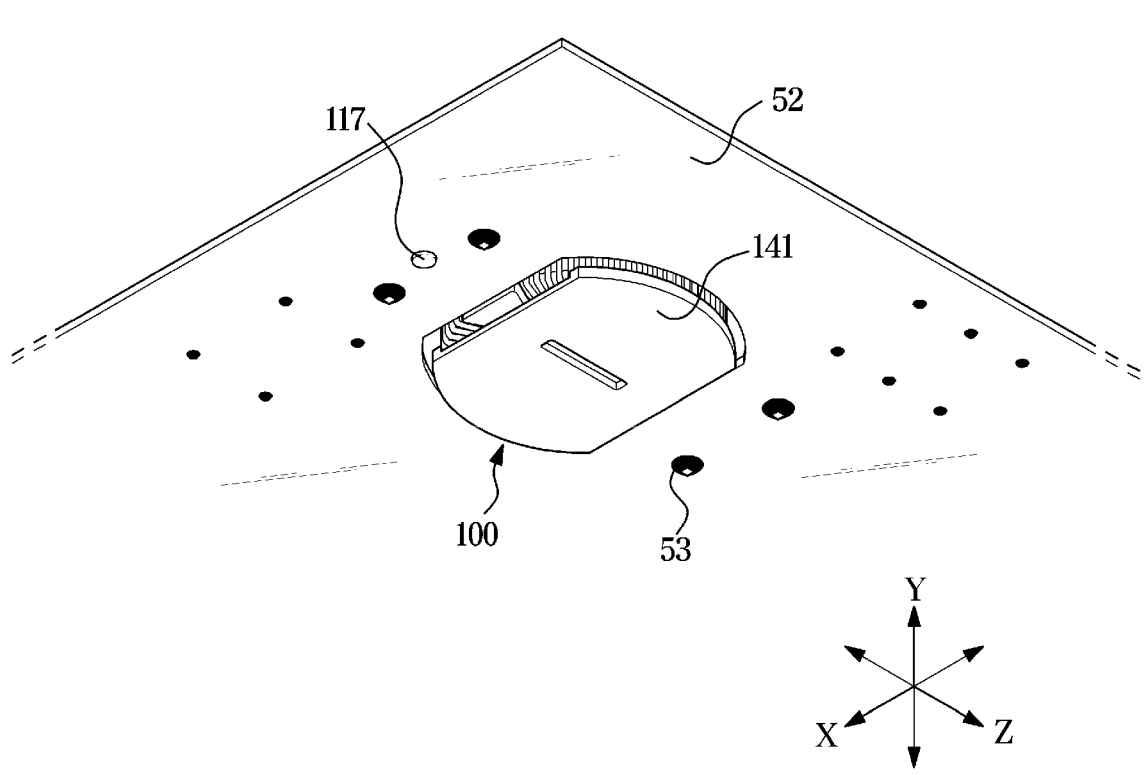
FIG. 5 is a view illustrating the line filter shown in FIG. 4 when viewed from another angle according to an embodiment of the present disclosure.

FIG. 4 is a view illustrating the line filter in the display device shown in FIG. 1. FIG. 5 is a view illustrating the line filter shown in FIG. 4 when viewed from another angle.

Referring to FIGS. 4 and 5, the display device may include the power supply board 50 configured to supply power to the display device. The power supply board 50 may be disposed adjacent to the rear cover (refer to FIG. 2). However, the location of the power supply board 50 is not limited thereto.

The power supply board 50 may include a printed circuit board 52, and the line filter 100 mounted on (connected to) the printed circuit board 52. In addition, the power supply board 50 may include components necessary for driving the display device, such as a capacitor 70. That is, the capacitor 70 may also be mounted on the printed circuit board 52.

The line filter 100 may include a connection pin 115 electrically connected to the printed circuit board 52. The connection pin 115 may be electrically connected to the coil 150 wound around the line filter 100. AC power may be applied to the connection pin 115.

The connection pin 115 may be provided in plurality. The plurality of connection pins 115 may include a first connection pin 115a, a second connection pin 115b, a third connection pin 115c, and a fourth connection pin 115d. At least one of the plurality of connection pins 115 may be connected to the neutral line of an AC power source. In addition, at least one of the remaining connection pins 115 other than the connection pin 115 connected to the neutral line may be connected to the live line.

For example, in the drawing, the first connection pin 115a may be connected to the neutral line, and the second connection pin 115b may be connected to the live line.

The line filter 100 may include a first region 101 and a second region 102 around which the coil 150 is wound. In the line filter 100, the first region 101 may be disposed on one side along a first direction X, and the second region 102 may be disposed on the other side along the first direction X. The coil 150 may be wound around the line filter 100. A first coil 151 may be wound in the first region 101, and a second coil 152 may be wound in the second region 102.

Each coil 150 may be soldered to the connection pin 115. Particularly, the first coil 151 may be soldered to the first connection pin 115a, and the second coil 152 may be soldered to the second connection pin 115b. Accordingly, the first coil 151 may be connected to the neutral line, and the second coil 152 may be connected to the live line.

In the drawing, the coils 150 are each soldered to the top of the connection pin 115, but it is not limited thereto, and the coil 150 may be soldered to the bottom of the connection pin 115. In addition, the first connection pin 115a and the second connection pin 115b may be soldered to the top of the connection pin 115, and the third connection pin 115c and the fourth connection pin 115d may be soldered to the bottom of the connection pin 115. Alternatively, the first connection pin 115a and the second connection pin 115b may be soldered to the bottom of the connection pin 115, and the third connection pin 115c and the fourth connection pin 115d may be soldered to the top of the connection pin 115.

The power supply board 50 may include a supporter 53 for maintaining a separation distance from other components in the display device. Due to the supporter 53, the power supply board 50 may be prevented from being damaged by other components, and from damaging to other components.

The line filter 100 may have a predetermined separation distance from the printed circuit board 52. Particularly, a separator 140 of the line filter 100 may have a predetermined separation distance from the board 52. Details are described below.

The line filter 100 may further include an indicator protrusion 117, which will be described in detail later.

Figure 6:
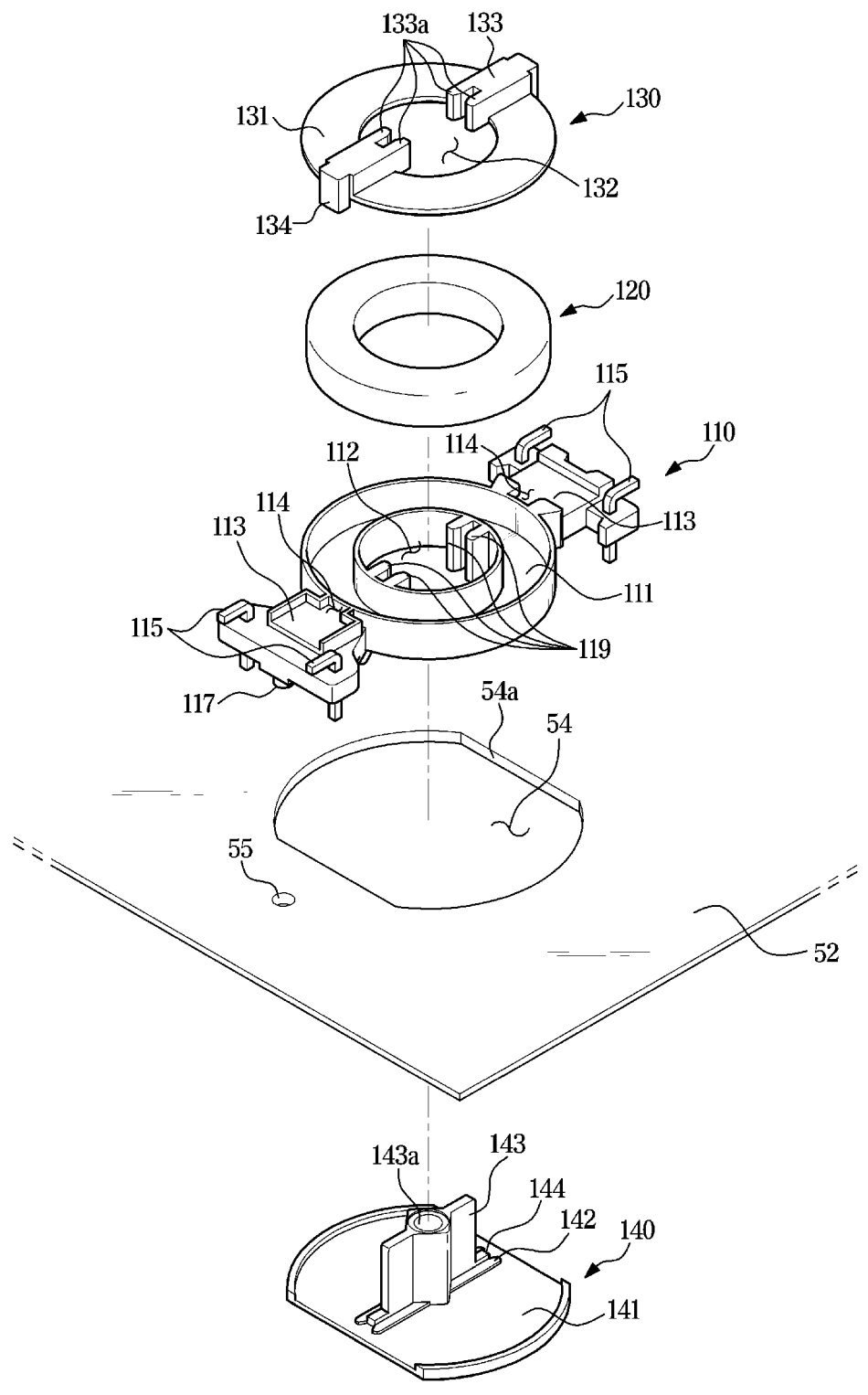
FIG. 6 is an exploded perspective view of the line filter shown in FIG. 4 according to an embodiment of the present disclosure.
Figure 7:
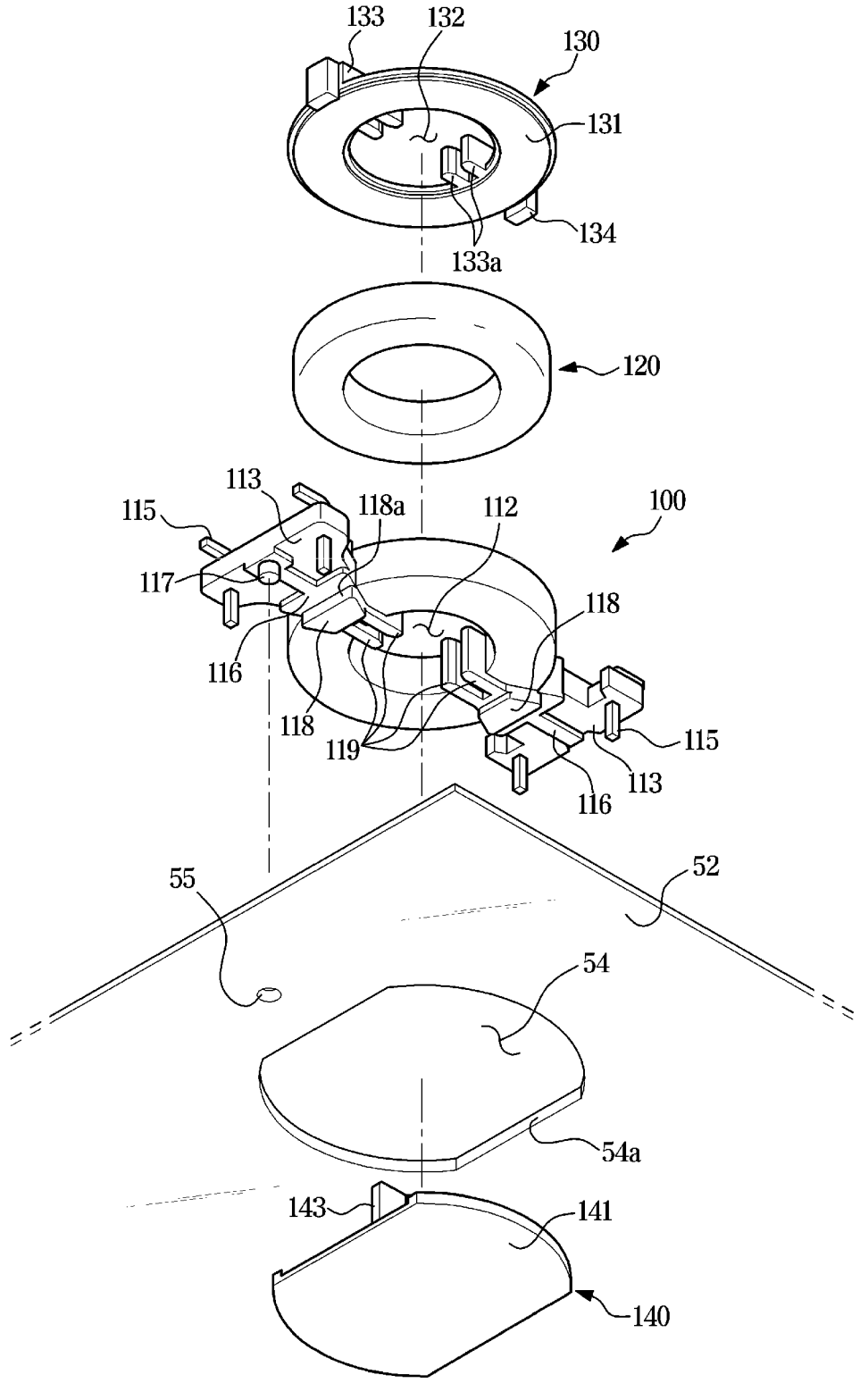
FIG. 7 is a view illustrating the line filter shown in FIG. 6 when viewed from another angle according to an embodiment of the present disclosure.

FIG. 6 is an exploded perspective view of the line filter shown in FIG. 4. FIG. 7 is a view illustrating the line filter shown in FIG. 6 when viewed from another angle.

Referring to FIGS. 6 and 7, the line filter 100 may include a case 110, a magnetic core 120, a core cover 130, and the separator 140. The case 110, the magnetic core 120, and the core cover 130 may have an annular shape.

The case 110 will be described. The case 110 may include a receiving portion 111, a hollow 112, a connector 113, a coupling groove 114, the connection pin 115, a contact portion 116, the indicator protrusion 117, a fixing guide 118, and a first guide rib 119.

The receiving portion 111 may be provided in an annular shape to receive the magnetic core 120. The magnetic core 120 may be seated in the receiving portion 111, and the magnetic core 120 may be stably seated in the receiving portion 111 through the core cover 130 described later.

The connector 113 may be arranged outside the receiving portion 111. The connector 113 may be provided on opposite sides of the receiving portion 111. That is, the connector 113 may be provided in plurality. The connection pin 115 for electrically connecting the line filter 100 to the coil 150 and the board 52 may be coupled to each of the plurality of connectors 113. The contact portion 116 and the indicator protrusion 117 may be formed in the connector 113.

The coupling groove 114 may be provided on the outside of the receiving portion 111. The coupling groove 114 may be provided in the receiving portion 111. The coupling groove 114 may be formed to correspond to a coupling protrusion 134 of the core cover 130. The coupling groove 114 and the coupling protrusion 134 may be fitted and coupled. Thus, the case 110 and the core cover 130 may be stably coupled. Accordingly, the magnetic core 120 may be stably received between the case 110 and the core cover 130.

The contact portion 116 may protrude downward from the connector 113. That is, the contact portion 116 may protrude from the connector 113 in a second direction Y. Accordingly, the contact portion 116 may be provided in plurality on opposite sides of the receiving portion 111. The contact portion 116 may be in contact with one surface of the printed circuit board 52 to allow the case 110 to be stably mounted on the board 52.

The indicator protrusion 117 may protrude downward from the connector 113. That is, the indicator protrusion 117 may protrude from the connector 113 in the second direction Y. When a user inserts the line filter 100 into the board 52, the indicator protrusion 117 may allow the user to recognize a mounting direction of the line filter 100 and to correctly insert the line filter 100 into a hole 54. The indicator protrusion 117 may be inserted into a protrusion insertion member 55 provided on the board 52. In the drawings, the protrusion insertion member 55 is shown as a hole penetrating the board 52, but is not limited thereto, and may be formed in a groove shape as long as the indicator protrusion 117 is stably inserted.

A portion of the line filter 100 may be inserted into the hole 54 of the board. The fixing guide 118 may be provided to be in contact with a hole forming surface 54a. The fixing guide 118 may protrude downward from at least one of the receiving portion 111 or the connector 113. That is, the fixing guide 118 may be inserted into the hole 54, and particularly, a contact surface 118a of the fixing guide 118 may be in contact with the hole forming surface 54a. Accordingly, when the line filter 100 is mounted on the board 52, the line filter 100 may be stably mounted on the board 52 without being rotated or separated from the hole 54.

The first guide rib 119 may protrude from the receiving portion 111 toward the hollow 112. That is, the first guide rib 119 may protrude from the receiving portion 111 in a third direction Z. The first guide rib 119 may guide the insertion of the separator 140. An isolating portion 143 and an insertion member 144 may be inserted between the first guide ribs 119.

The case 110 may be formed of a material having a high melting point so as not to melt due to a soldering temperature when the line filter 100 is soldered to the board 52. For example, the case 110 may be formed of a phenolic resin. Therefore, the case 110 may be connected to the board 52 without an additional structure.

By using the contact portion 116 and the fixing guide 118, the line filter 100 may be stably mounted on the board 52 without the additional structure. Accordingly, the additional structure may be omitted, and thus a manufacturing cost may be saved and a production efficiency may be increased. In addition, because there is no additional structure, a thickness of the power supply board 50 and the electronic device including the line filter 100 may be reduced.

The core cover 130 will be described. The core cover 130 may be coupled to the case 110. The core cover 130 may include a cover member 131, a hollow 132, a second guide rib 133, and a coupling protrusion 134.

The cover member 131 may be coupled to the case 110 at one side of the case 110 to cover the magnetic core 120 received in the case 110. Accordingly, the cover member 131 may be formed in an annular shape.

The second guide rib 133 may protrude upward from the cover member 131. That is, the second guide rib 133 may protrude from the cover member 131 in the second direction Y. Referring to FIG. 4, the second guide rib 133 may protrude more upward than the wound first coil 151 and the second coil 152. That is, the second guide rib 133 may be formed to be higher than the coil 150. Therefore, when winding the first coil 151 and the second coil 152, respectively, it is possible to prevent the first coil 151 from crossing over the second guide rib 133 and coming into contact with the second coil 152 in the second region 102, and to prevent the second coil 152 from coming into contact with the first coil 151 in the first region 101. Accordingly, it is possible to prevent a short circuit due to contact between the first coil 151 and the second coil 152.

The second guide rib 133 may further include a protrusion 133a protruding in the third direction Z. The protrusion 133a may guide the insertion of the separator 140. The isolating portion 143 may be inserted between the protrusions 133a.

The coupling protrusion 134 may protrude toward the case 110. The coupling protrusion 134 may be fitted and coupled to the coupling groove 114 provided in the case 110. Accordingly, the magnetic core 120 may be stably received between the case 110 and the core cover 130. The coupling protrusion 134 may be provided in plurality to correspond to the coupling groove 114.

The board 52 will be described. The board 52 may include the hole 54 in which the line filter 100 is received, and the protrusion insertion member 55. The receiving portion 111 and the fixing guide 118 of the case 110 may be inserted into the hole 54. In addition, the board 52 may include the hole forming surface 54a forming the hole 54. The hole forming surface 54a may be in contact with the fixing guide 118 to allow the line filter 100 to be stably soldered to the line filter 100 without rotation. The protrusion insertion member 55 may be formed at positions corresponding to the indicator protrusion 117.

The separator 140 will be described. The separator 140 may include a base 141, a stepped portion 142, the isolating portion 143, and the insertion member 144. The stepped portion 142, the isolating portion 143, and the insertion member 144 may protrude toward the case 110 from the base 141. That is, the stepped portion 142, the isolating portion 143, and the insertion member 144 may protrude from the base 141 in the second direction Y.

The base 141 may be provided below the stepped portion 142, the isolating portion 143, and the insertion member 144, so as to support the stepped portion 142, the isolating portion 143, and the insertion member 144. The base 141 may be provided in a size and shape corresponding to the hole 54 to cover the hole 54 of the board. Because the base 141 covers the hole 54, it is possible to prevent the power supply board 50 from being electrically shorted with other components in the electronic device.

The stepped portion 142 may be in contact with the first guide rib 119 to form a predetermined separation distance between the board 52 and the base 141. Details will be described later with reference to FIG. 8.

The isolating portion 143 may be inserted to pass through the hollow 112 of the case and the hollow 132 of the core cover, thereby separating between the first region 101 in which the first coil 151 is wound, and the second region 102 in which the second coil 152 is wound. The isolating portion 143 may include an isolating core 143a at the center thereof.

The insertion member 144 may be inserted between the first guide ribs 119. Accordingly, the separator 140 may be stably inserted into the case 110 without shaking.

Figure 8:
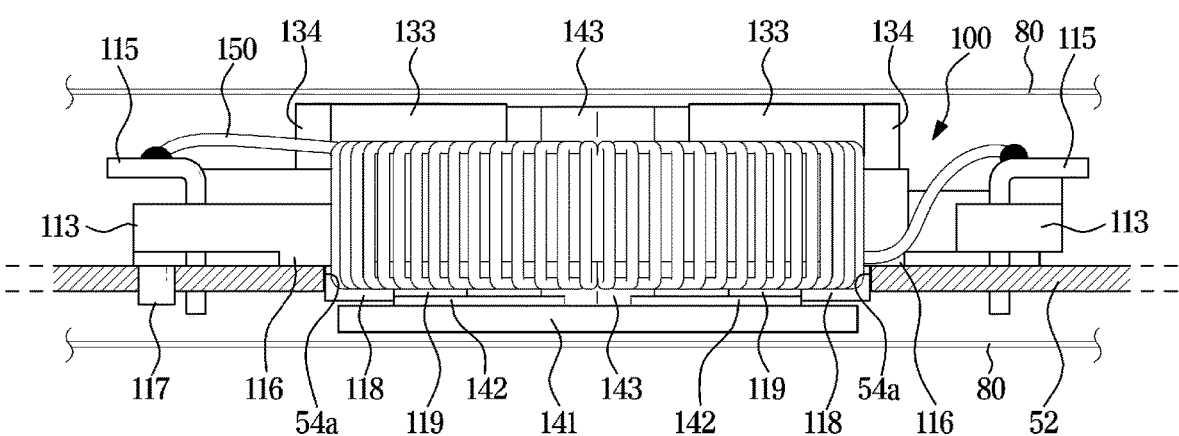
FIG. 8 is a side view of a power supply board in the display device shown in FIG. 1 according to an embodiment of the present disclosure.

FIG. 8 is a side view of a power supply board in the display device shown in FIG. 1.

Referring to FIG. 8, the line filter 100 may be mounted on the board 52. As described above, the contact portion 116 may be in contact with the board 52 to allow the line filter 100 to be stably mounted on the board 52. That is, the contact portion 116 may maintain flatness when the line filter 100 is mounted on the board 52. In addition, the fixing guide 118 may be inserted into the hole 54 of the board and come into contact with the hole forming surface 54a to allow the line filter 100 to be stably inserted into the hole 54 without being rotated. In addition, the second guide rib 133 may have a higher height than the coil 150 to prevent the first coil 151 or the second coil 152 from being wound in another region.

The display device may further include an insulator 80. The power supply board 50 may be disposed between the insulators 80 so as not to affect other components in the display device. The insulator 80 may be a thin insulating paper 80.

The first guide rib 119 may be in contact with the stepped portion 142. Accordingly, the base 141 may be spaced apart from the board 52 by a predetermined distance. When the stepped portion 142 has a higher height than shown in the drawing, the base 141 may be further spaced apart from the board 52. The base 141 may allow the board 52 and the insulator 80 to be spaced apart from each other by a predetermined distance.

Therefore, the base 141 may form a space between the board 52 and the insulating paper 80, and thus even when an impact is applied from the outside of the display device, it is possible to prevent that the insulating paper 80 is damaged by components such as the connection pin 115, caused by the board 52 that is deformed and a shape of thereof is changed. As shown in FIG. 5, the supporter 53 may also achieve this effect.

Figure 9:
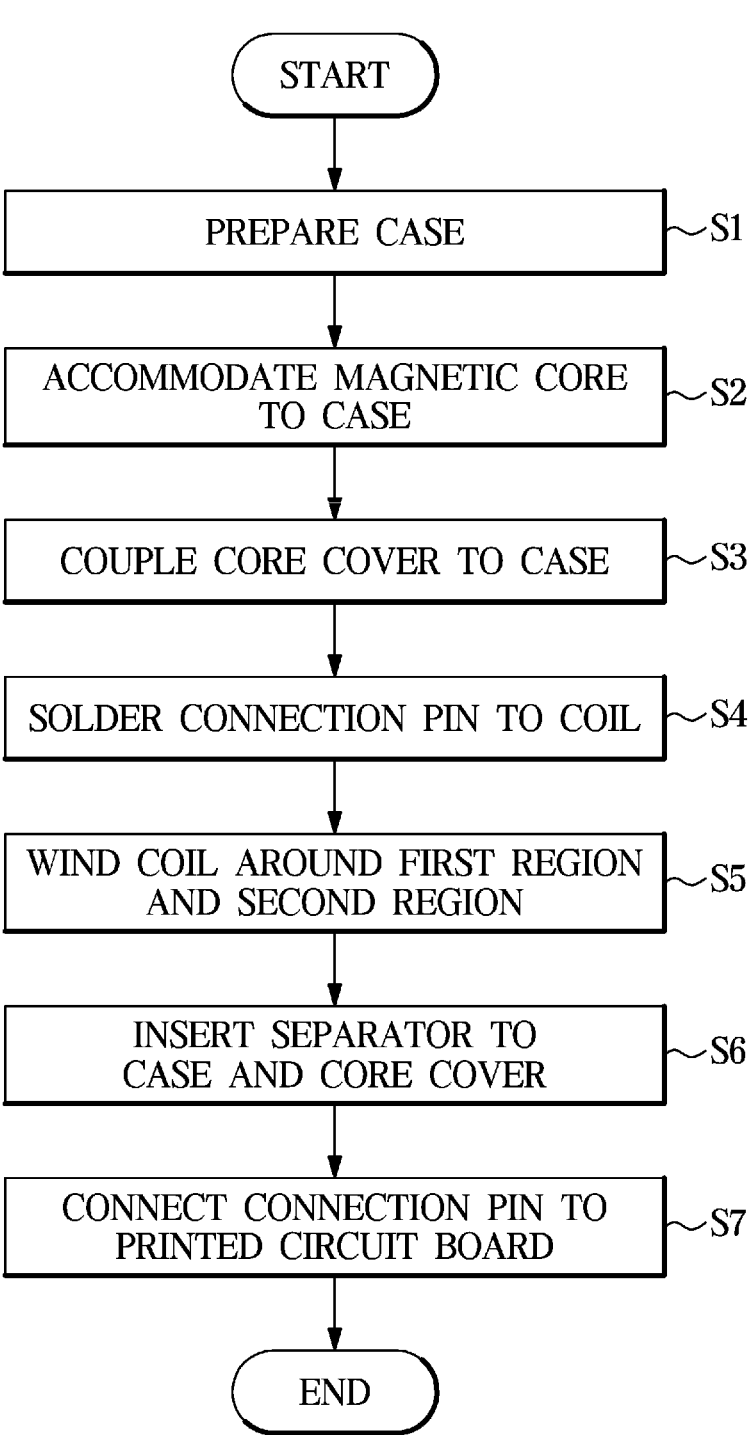
FIG. 9 is a flowchart illustrating a method of manufacturing the power supply board according to one embodiment of the present disclosure.

FIG. 9 is a flowchart illustrating a method of manufacturing the power supply board according to one embodiment of the present disclosure.

Referring to FIG. 9, in the manufacturing method of the line filter 100, the case 110 may be prepared (1), the magnetic core may be accommodated in the case 110 (2), the core cover 130 may be coupled to the case 110 (3), the connection pin 115 provided on the case 110 may be soldered to the coil 150 (4), the coil 150 may be wound around the first region 101 and the second region 102 provided outside the case 110 and the core cover 130 (5), and the separator 140 may be inserted into the case 110 and the core cover 130 (6). The power supply board 50 may be manufactured by manufacturing the line filter 100 and then connecting the connection pin 115 to the printed circuit board 52 (7).

At this time, the second guide rib 133 may be formed at a height higher than that of the coil 150 as described above. Therefore, the first coil 151 to which the neutral line is connected may not be in contact with the second coil 152 to which the live line is connected.

The coil 150 may wound around the first region 101 and the second region 102 after the connection pin 115 is soldered to the coil 150. Accordingly, it is possible to identify whether the first coil 151 and the second coil 152 are wound at a proper position without being in contact with each other. Therefore, the production of defective products may be reduced and the production efficiency may be increased While the present disclosure has been particularly described with reference to exemplary embodiments, it should be understood by those of skilled in the art that various changes in form and details may be made without departing from the spirit and scope of the present disclosure.

What is claimed is:

1. A display device including a display panel, the display device comprising:

a power supply board, configured to supply power to the display device, and including a line filter, wherein the line filter is configured to remove noise and the line filter includes:

a case, connectable to a printed circuit board to thereby allow the line filter to be electrically connected to the printed circuit board;

a magnetic core to be accommodated in the case while the case is connected to the printed circuit board;

a core cover coupleable to the case to cover the magnetic core while the magnetic core is accommodated in the case;

a coil wound around an outside of the case and the core cover; and a separator coupleable to the case and the core cover, wherein the separator includes:

a base;

an isolating portion protruding from the base to be insertable into the case and the core cover to thereby allow the separator to be coupled to the case and the core cover so as to isolate a region in which the coil is wound; and a stepped portion protruding from the base and in contact with one surface of the case to separate the base from the printed circuit board, wherein at least a portion of the case is disposed on one side of the printed circuit board, and wherein the base is disposed spaced apart from the printed circuit board on another side opposite to the one side of the printed circuit board.

2. The display device of claim 1, wherein the case and the core cover have an annular shape, the case includes:

a first guide rib protruding toward a hollow portion of the case to allow the separator to be inserted into the hollow portion of the case; and the core cover includes:

a second guide rib protruding toward a hollow portion of the core cover to allow the separator to be inserted into the hollow portion of the core cover, wherein the stepped portion is in contact with the first guide rib.

3. The display device of claim 2, wherein the printed circuit board includes a hole into which at least a portion of the line filter is insertable, wherein the base of the separator of the line filter is configured to cover the hole.

4. The display device of claim 3, wherein alternate current (AC) power is applied to the power supply board through a live line and a neutral line, wherein the region is a first region, in which the coil is wound, on a first side of the case and the core cover along a first direction, the first region being where a coil connected to the live line is wound, and the isolating portion isolates a second region on a second side of the case and the core cover along the first direction, the second region being where a coil connected to the neutral line is wound, wherein the isolating portion is configured to pass through the hollow portion of the case and the hollow portion of the core cover to isolate the first region and the second region from each other.

5. The display device of claim 4, wherein the coil includes a first coil wound around the first region and a second coil wound around the second region, wherein the second guide rib further protrudes in a second direction to prevent the first coil and the second coil from coming into contact with each other.

6. The display device of claim 1, wherein the core cover includes a coupling protrusion protruding downward from an outer circumferential surface of the core cover to be coupled to an upper side of the case, wherein the case includes a coupling groove positioned to correspond to the coupling protrusion.

7. The display device of claim 1, wherein the printed circuit board includes a hole into which at least a portion of the line filter is insertable, wherein the case includes a fixing guide protruding downward to be in contact with at least a portion of a surface of the printed circuit board where the hole of the printed circuit board is formed, so as to guide a fixation of the line filter based on the line filter being connected to the printed circuit board.

8. The display device of claim 7, wherein the case includes:

a receiving portion having an annular shape to accommodate the magnetic core;

a connector formed on an outer circumferential surface of the receiving portion, the connector including a connection pin through which the line filter is electrically connected to the printed circuit board; and a contact portion protruding downward from the connector to be in contact with the printed circuit board.

9. The display device of claim 8, wherein the case includes an indicator protrusion protruding downward from the connector to guide a direction of the line filter along which the line filter is electrically connected to the printed circuit board.

10. The display device of claim 1, wherein the case and the core cover are formed of different materials, wherein the case includes a phenol-based resin to allow the case to have a heat resistance higher than a heat resistance of the core cover.

* * * * *